US008304784B2

(12) United States Patent
Locke

(10) Patent No.: US 8,304,784 B2
(45) Date of Patent: Nov. 6, 2012

(54) ILLUMINATION DEVICE

(76) Inventor: Andrew Locke, Trabuco Canyon, CA (US)

(*) Notice: Subject to any disclaimer, the term of this patent is extended or adjusted under 35 U.S.C. 154(b) by 498 days.

(21) Appl. No.: 12/646,918

(22) Filed: Dec. 23, 2009

(65) Prior Publication Data

US 2010/0213469 A1 Aug. 26, 2010

Related U.S. Application Data

(60) Provisional application No. 61/155,074, filed on Feb. 24, 2009, provisional application No. 61/164,028, filed on Mar. 27, 2009.

(51) Int. Cl.
*H01L 33/00* (2010.01)

(52) U.S. Cl. .......... 257/77; 257/88; 257/89; 257/98; 257/E33.002; 257/E33.013; 257/E33.014; 257/E33.026; 257/E33.035; 257/E33.074

(58) Field of Classification Search .......... 257/77, 257/88, 89, 95, 98, E33.002, E33.013, E33.014, 257/E33.026, E33.035, E33.074
See application file for complete search history.

(56) References Cited

U.S. PATENT DOCUMENTS

| 6,227,679 B1 | 5/2001 | Zhang |
| 6,499,860 B2 | 12/2002 | Begemann |
| 6,598,996 B1 | 7/2003 | Lodhie |
| 6,948,829 B2 | 9/2005 | Verdes |
| 7,354,174 B1 | 4/2008 | Yan |
| 2001/0050530 A1 | 12/2001 | Murakami et al. |
| 2003/0006419 A1 | 1/2003 | Woodall et al. |
| 2004/0245540 A1 | 12/2004 | Hata et al. |
| 2005/0082544 A1* | 4/2005 | Narukawa et al. ............... 257/79 |
| 2006/0214603 A1 | 9/2006 | Oh et al. |
| 2006/0258027 A1 | 11/2006 | Ohmae et al. |
| 2007/0012240 A1 | 1/2007 | Sia et al. |
| 2007/0018186 A1 | 1/2007 | Shin et al. |
| 2008/0073657 A1* | 3/2008 | Liang et al. ..................... 257/89 |
| 2008/0121910 A1 | 5/2008 | Bergmann et al. |
| 2008/0303018 A1 | 12/2008 | Kim |

FOREIGN PATENT DOCUMENTS

| EP | 0704914 A1 | 4/1996 |
| EP | 0781660 A1 | 7/1997 |
| KR | 10-0825137 B1 | 4/2008 |
| KR | 10-2009-0006667 A1 | 1/2009 |
| WO | 2007-127513 A2 | 11/2007 |

* cited by examiner

*Primary Examiner* — Matthew Reames
*Assistant Examiner* — Ermias Woldegeorgis
(74) *Attorney, Agent, or Firm* — Heidi L. Eisenhut; Loza & Loza, LLP

(57) ABSTRACT

An illumination device having a plurality of light emitting diodes is provided. The light emitting diode may include a plurality of semiconductor layers at least one of which has a light emitting surface which may include a rough surface pattern having a pre-determined pattern. The pre-determined pattern may include one or more impurity regions with each region having a recess for guiding current across the light emitting surface and maximizing the emission of light (i.e. light intensity) of the illumination device. Each recess may include a lower internal portion having a bottom contact point located on a bottom surface and an upper internal portion integrally connected to the lower internal portion by a plurality of center contact points. The gaps created between the center and bottom contact points in adjacent recesses may act as spark gaps allowing for the current to flow through the entire light emitting surface.

20 Claims, 15 Drawing Sheets

ILLUMINATION DEVICE

CLAIM OF PRIORITY UNDER 35 U.S.C. §119

The present Utility Application for Patent claims priority to U.S. Provisional Application No. 61/164,028 entitled "Illumination Device" filed Mar. 27, 2009, and U.S. Provisional Application No. 61/155,074 entitled "Illumination Device" filed Feb. 24, 2009, both of which are hereby expressly incorporated by reference herein.

FIELD

Various embodiments described herein pertain to an illumination device, and more particularly to an illumination device utilizing light emitting diodes (LEDs).

BACKGROUND

Conventional illumination systems or light sources have been used for many years in general lighting and in lighting for decoration, advertising, warning, guidance and entertainment applications. Such light sources utilize a variety of lights, including but not limited to incandescent, Halogen and Fluorescent types, which are subject to many drawbacks. For example, halogen and incandescent lights produce undesirable heat and are limited to producing only white or yellow light. Additionally, these conventional light sources may also have limited longevity with lifetimes significantly less than a few thousand hours. Such light sources are also susceptible to breakage in high shock and vibration prone environments.

Light Emitting Diode (LED) sources have recently undergone significant advances, which enables them to be a cost effective replacement for conventional light sources. LED light sources offer significant benefits over conventional light sources as they consume less electrical energy for a given light intensity while exhibiting much longer lifetimes. Other desirable properties of LEDs include high resistance to shock or vibration, low heat dissipation, very fast switching response times and a wide choice of illuminating colors.

LEDs are illuminated solely by the movement of electrons in a semiconductor material. The LED consists of a chip of semiconducting material impregnated, or doped, with impurities to create a p-n junction. As in other diodes, current flows easily from the p-side, or anode, to the n-side, or cathode. Charge-carriers—electrons and holes—flow into the junction from electrodes with different voltages. When an electron meets a hole, it falls into a lower energy level, and releases energy in the form of a photon, i.e. light.

Most materials used for LED production have very high refractive indices which causes much of the light emitted from the diode to be reflected back in to the material at the material's surface containing the diodes. The light that is reflected back is then absorbed and turned into additional heat. As of result, this inefficiency causes an increase of heat and lower light output as the light is being reflected onto the material/diode. As a consequence of the increased heat, with existing LED technology, each LED must be treated individually or one chip at a time. For example, a LED flashlight utilizes clusters of LEDs and each LED in the cluster of LEDs is treated individually. If the LEDs are not treated individually, the LED chip produces undesirable heat as a result of the refractive indices as described above.

Accordingly, a need exists for illumination methods and systems that overcome the drawbacks of conventional illumination systems and that take advantage of the possibilities offered by overcoming such drawbacks.

SUMMARY

The following presents a simplified summary of one or more embodiments in order to provide a basic understanding of some embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to one feature, an illumination device having a plurality of light emitting diodes is provided. Each of the light emitting diodes may include a plurality of semiconductor layers at least one of which has a light emitting surface. The light emitting surface may include a rough surface pattern having a randomized pattern or a pre-determined pattern. When using a pre-determined pattern, the light emitting surface may be divided into one or more impurity regions, where each impurity region may have approximately the same surface area.

A recess may be included within each impurity region for guiding current across the light emitting surface and maximizing the emission of light (i.e. light intensity) of the illumination device by minimizing light reflected into the surface (which turns into additional heat). Each recess may include a lower internal portion having a bottom contact point located on a bottom surface and an upper internal portion integrally connected to the lower internal portion by a plurality of center contact points.

Furthermore, each recess may comprise a plurality of outer side edges and a plurality of inwardly projecting side edges integrally connected to the plurality of outer side edges forming an outer surface perimeter. A first plurality of downwardly sloping side walls may be integrally connected to the outer side edges, the first plurality of downwardly sloping side walls projecting inwardly to the plurality of center contact points. A plurality of vertical side walls may extend in a downwardly direction from the outer surface perimeter and may be integrally connected to the plurality of inwardly projecting side edges. In one aspect, the plurality of vertical side walls may extend downwardly at an angle of 90° converging to the plurality of center contact points. Additionally, each of the vertical side walls may form an equilateral triangle.

The recess may further comprise a second plurality of downwardly sloping side walls where each side wall of the second plurality of downwardly sloping side walls may include a first end formed at the junction of the outer side edges and the plurality of inwardly projecting side edges and a second end formed at the bottom contact point. In one aspect, the second plurality of downwardly sloping side walls may extend downwardly from the outer surface perimeter at an angle of 45° and converge at the bottom contact point.

Applying a voltage across the light emitting surface of the diode may cause a current to flow from the first end to the second end through the plurality of impurity regions. As the current flows through the impurity regions, free electrons moving across the light emitting surface may fall into empty holes in the P-type layer of the diode resulting in the electrons releasing energy in the form of photons, i.e. light. Center and bottom contact points may function as serially connected electrodes such that the gaps created between the contact points in adjacent recesses may act as spark gaps allowing for the current to flow from the first end of the diode to the second end.

In one aspect, the plurality of impurity regions, and corresponding recesses, may be organized into an array of rows and columns between the first end and the second end of the light emitting surface. The rows and columns of the array may be aligned such that each row may include the same number of recesses and each column may include the same number of recesses.

In another aspect, the plurality of impurity regions, and corresponding recesses, may be organized into an array of rows where alternating rows of the array may be off-set, such as a distance of half a recess. By off-setting alternating rows of impurity regions, spark gaps created between center and bottom contact points may be closer together, i.e. a smaller gap, which in turn may increase the efficiency of the light emitting surface as less energy is lost as the current may continuously flow from the first end to the second end of the light emitting surface resulting in more light being emitted outwards.

DETAILED DESCRIPTION

Figure 1:
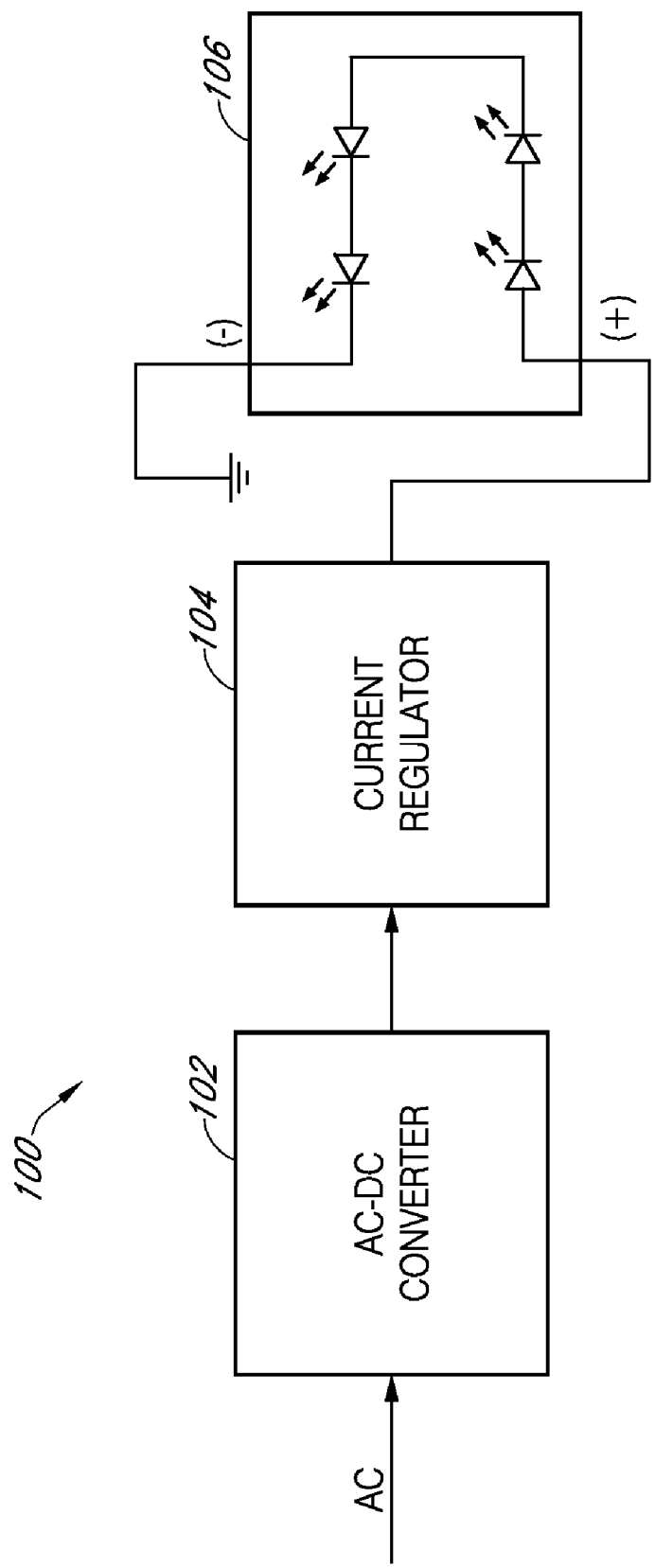
FIG. 1 illustrates internal circuitry of an illumination device according to one aspect.

In the following description numerous specific details are set forth in order to provide a thorough understanding of the illumination device. However, one skilled in the art would recognize that the illumination device might be practiced without these specific details. In other instances, well known methods, procedures, and/or components have not been described in detail so as not to unnecessarily obscure aspects of the illumination device.

The term "illuminate" should be understood to refer to the production of a frequency of radiation by an illumination source. The term "color" should be understood to refer to any frequency of radiation within a spectrum; that is, a "color," as used herein, should be understood to encompass frequencies not only of the visible spectrum, but also frequencies in the infrared and ultraviolet areas of the spectrum, and in other areas of the electromagnetic spectrum.

Heat Dissipation

Excess heat in a chip having light emitted diodes (LED) may be the result of excess power dissipation. As is well known, power (P) dissipated is equal to the current (I) multiplied by the voltage (V), i.e., P=IV. In a traditional LED, to achieve the proper wattage, the current supplied to the LED may be at a high rate while causing the voltage to be low as current is dependent exponentially on the voltage—see Shockley diode equation (below) which relates the diode current I of a p-n junction diode to the diode voltage $V_D$ $$I=I_S(e^{V_D/(nV_T)}-1)$$

where $I_S$ is the saturation current or scale current of the diode (the magnitude of the current that flows for negative $V_d$ in excess of a few $V_T$, typically $10^{-12}$ A). The scale current is proportional to the diode area. $V_T$ is the thermal voltage n is known as the diode ideality factor (for silicon diodes n is approximately 1 to 2).

In other words, in a LED, a small change in voltage can lead to a large change in current so if the maximum voltage rating is exceeded by a small amount, the current rating may be exceeded by a large amount, potentially damaging or destroying the LED. Consequently, packaging multiple existing LEDs in a chip may result in the chip overheating and reaching temperatures of up to 400° F. or more, depending on how many individual diodes are being utilized.

In typical prior art approaches, the power may be regulated to the LED in the form of a driver which provides pulse modulation to the LED causing the excitation of the LED, i.e. the emission of light. Pulse modulation schemes may transfer a narrowband analog signal over an analog low pass channel as a two-level quantized signal, by modulating a pulse train. However, as described below, in the present application, a driver is not required as the current may be regulated to prevent the overheating of the LED due to excess current.

Unlike the typical or conventional approaches, the LED chip of the present application may be provided with constant power and not in bursts of energy. In other words, the power may be continuous, whereas with standard, existing LEDs, pulse modulation is used. By constantly regulating the current and voltage as in the present application, the temperature of the LED chip may be controlled.

To control the current and voltage applied to the LEDs, a current regulator, described below in greater detail, may be used. To achieve the desired wattage of the lighting or illumination device, a high voltage may be combined with the lower current. For example, with a five (5) Watt LED, heat dissipating from the LED may be controlled by introducing a voltage of 14.29 V with a current of 350 mA to achieve the 5 Watts. As a result, power, i.e. heat, may be dispersed among all the individual LEDs in the chip. If the chip includes a plurality of LEDs, such as nine (9), packaged together, the heat may be dispersed among all nine (9) LEDs. Additionally, by being able to utilize 9 LEDs, a light intensity of 190 lumens per watt or more may be achieved. Consequently, running the package at 65-70% of power, a production of about 158 lumens per watt may be achieved with an emitted heat junction temperature of 50° C.

Internal Circuitry

As discussed above, to overcome the problems of overheating in the prior art, the current and voltage supplied to the LEDs may be used to control, i.e. reduce, the heat emitting from the LEDs. FIG. 1 illustrates internal circuitry 100 of an illumination device having four (4) individual LEDs. In operation, an alternate current (AC) voltage may be applied to an alternate current (AC) to direct current (DC) converter 102 for converting a voltage, such as 90V-340V AC, to a DC voltage. The DC voltage may then be input into, or pass through, a current regulator 104. The regulated current may then be input into a diode module 106 having a plurality of LEDs, causing the LEDs to illuminate.

In one aspect, the plurality of LEDs in the diode module 106 may be connected or arranged in series, i.e. a negative terminal of a first LED is connected to a positive terminal of a second LED, the negative terminal of the second LED is connected to a positive terminal of a fourth LED, etc.

The diode module 106, as described above, may be in the form of a chip or packaging having a plurality of semiconductor layers at least one of which has a light emitting layer. In one aspect, the light emitting layer may be made of silicon carbide. The plurality of LEDs on the light emitting layer of the diode module 106 may be connected to each other by any method known in the art, including but not limited to, etching through a silicon foundation and wire bonded to each other with a trace going in series from a first LED to a second LED to a third LED, etc. As shown in FIG. 1, the diode module 106 may include four (4) individual LEDs in series. The individual LEDs may be linked together in series in any format including, but not limited to, square, rectangular, circular and triangular.

Figure 2:
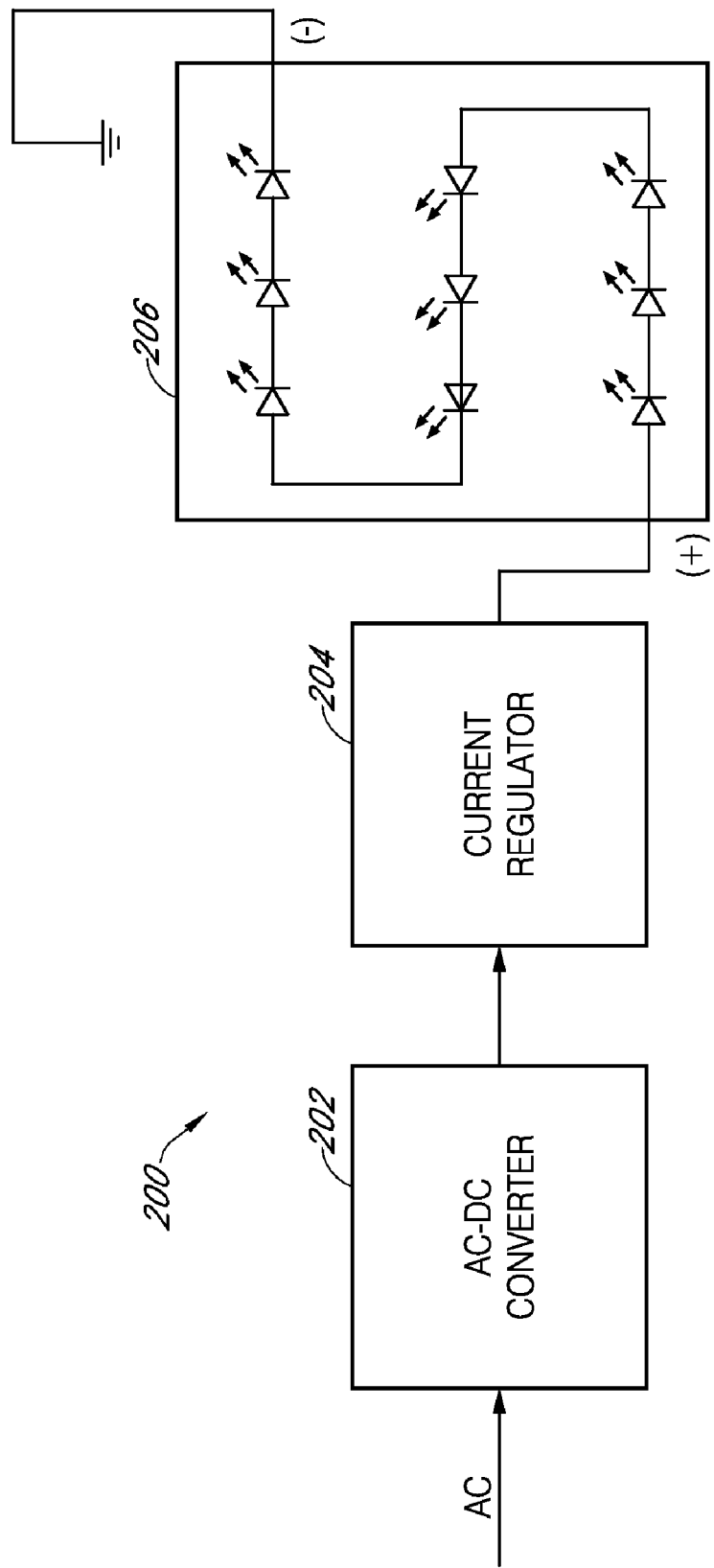
FIG. 2 illustrates internal circuitry of an illumination device according to one aspect.

FIG. 2 illustrates internal circuitry 200 of an illumination device having nine (9) individual LEDs. As discussed above, in operation, an AC voltage may be input into an AC to DC converter 202 for converting a voltage, such as 90V-340V AC, to a DC voltage. The DC voltage may then be input into a current regulator 204 causing regulated current to be input into a diode module 206 having the nine (9) individual LEDs connected in series.

The number of individual LEDs illustrated in FIGS. 1 and 2 is by way of example only and more or less LEDs may be utilized.

In one aspect, the light emitting diodes (LED) may be located on a ceramic and copper substrate which may act as a heat sink, however, this is by way of example and the substrate may be formed of any material known in the art, including, but not limited to, aluminum nitrate, aluminum oxide and silicon.

Rough Surface Pattern—Peaks and Valleys

As discussed previously, a LED may be comprised of a chip having a plurality of semiconducting materials at least one of which is a light emitting layer. The light emitting layer may be impregnated, or doped, with impurities to create a p-n junction. Current may flow from the p-side, or anode, to the n-side, or cathode of the LED. Charge-carriers—electrons and holes—flow into the junction from electrodes with different voltages. When an electron meets a hole, it may fall into a lower energy level, and release energy in the form of a photon, i.e. light. However, the materials used for LED production have very high refractive indices which cause much of the light emitted from the diode to be reflected back into the material at the material's surface/diodes. It is this reflection of the light back into the material's surface/diodes produces undesirable heat.

The present application overcomes the undesirable heat by reducing the internal reflections from the light emitting layer which traps emitted light inside. To reduce the internal reflections, the light emitting layer may include a rough surface pattern to reduce its reflective state. The rough surface pattern may be produced using Nano-Lithography or any other method known in the art.

Figure 3:
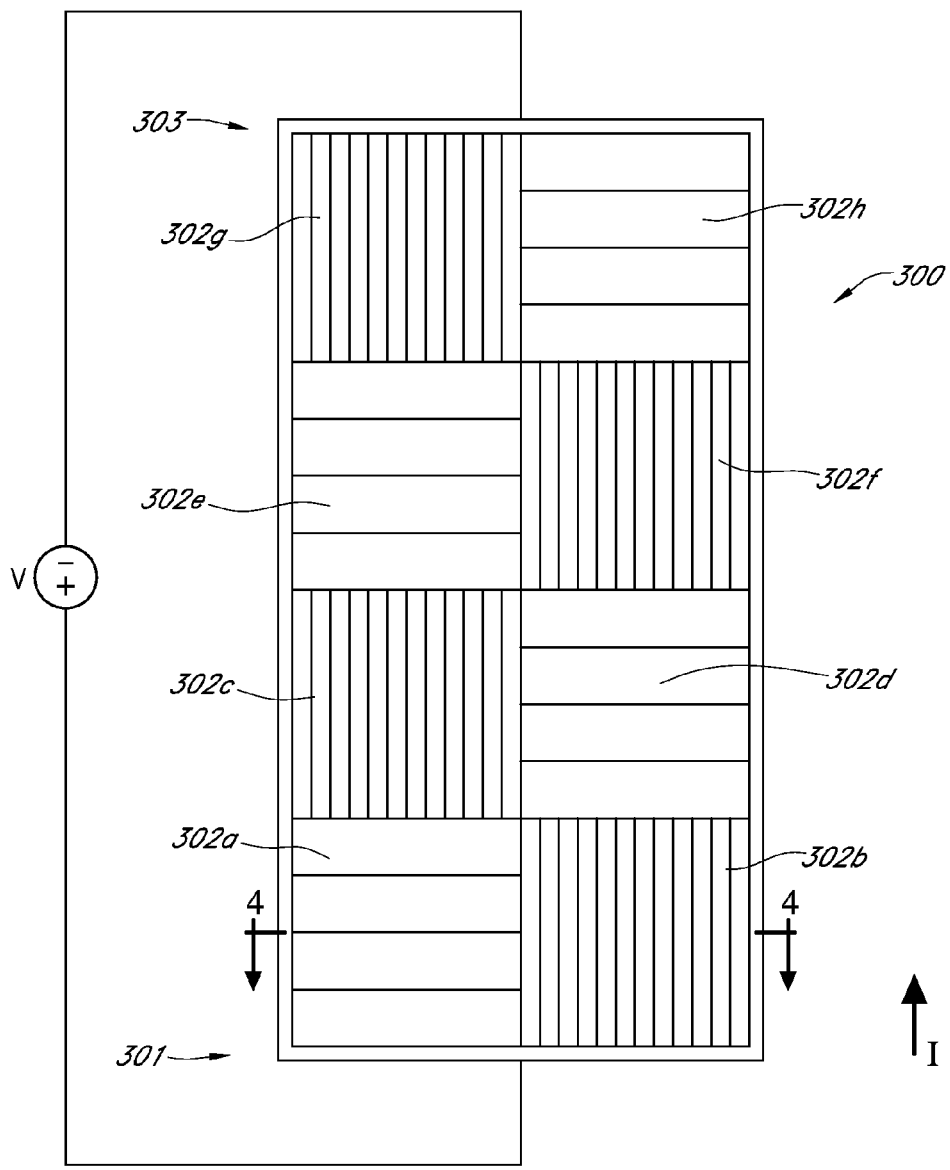
FIG. 3 illustrates a top plan view of a rough surface pattern on a light emitting layer of a diode according to one aspect

FIG. 3 illustrates a top plan view of a rough surface pattern on a light emitting layer of a diode according to one aspect. The rough surface pattern on the light emitting layer 300 of the diode may be created randomly or may be a pre-determined pattern.

The LED may be a p-n diode such that when voltage is applied to the light emitting layer, current (I) may flow through the impurity regions causing free electrons moving across the surface of the diode to fall into empty holes from the P-type layer resulting in the electrons releasing energy in the form of photons, i.e. light.

In one embodiment, the light emitting layer 300 may include a plurality of impurity regions 302a-302h where each impurity region may include one or more peaks 304 and valleys 306 which may direct the flow of current and/or cause emitted light to reflect outwards and not into the surface of the diode 300 resulting in unwanted heat. (See FIGS. 4 and 5) The plurality of impurity regions 302a-302h may be arranged such that a checkered pattern or configuration is formed by alternating the direction of the peaks and valleys in each region. As a result, the peaks and valleys in a first impurity region 302a may extend in a direction perpendicular to peaks and valleys in any directly adjacent impurity region. For example, the peaks and valleys located within a first impurity region 302a may extend perpendicularly to the peaks and valleys located within a second impurity region 302b and the peaks and valleys located in a third impurity region 302c. In other words, the direction of the peaks and valleys may alternate in adjacent regions. (See FIG. 5) In one aspect, the plurality of impurity regions may be approximately the same size.

The plurality of impurity regions 302a-302h may be divided into two groups, a first group having a first set of peaks and valleys and a second group having a second set of peaks and valleys. In one aspect, the number of peaks and valleys in the second set may be greater than the number of peaks and valleys in the first. Furthermore, the height of the peaks in the second set may be smaller than the height of the peaks in the first set. For example, the height of the peaks in the second set may be half (½) the height of the peaks in the first set, however, this is by way of example only.

As discussed above, alternating impurity regions may include a greater number of peaks and valleys then adjacent impurity regions. For example the second set of peaks and valleys in the second group, i.e. impurity regions 302b, 302c, 302f, and 302g, may include a greater number of peaks and valleys then in the first set of peaks and valleys in the first group, i.e. impurity regions 302a, 302d, 302e and 302h. Additionally, the height of the peaks in the first group may be greater than the height of the peaks in the second group. In one aspect, the angle, $\Theta_1$, between the peaks and valleys in the first group may be 45°, however, this is by way of example only and $\Theta_1$ may be any angle which allows the current to flow through the impurity regions. (FIG. 5) The angle, $\Theta_2$, between the peaks and valleys in the second group may be less than 45°, however this is by way of example only and $\Theta_2$ may be any angle which allows the light emitted outwards to be maximized while minimizing light reflected into the light emitting layer and as a result, minimizing the heat produced.

Applying a voltage to the light emitting layer 300 of the diode may cause current (I) to flow from a first end 301 to a second end 303. The current may flow through the light emitting layer 300 via the first set of peaks and valleys in the first group (i.e. impurity regions 302a, 302d, 302e, 302h) while the light may be emitted from the second set of peaks and valleys in the second group (i.e. impurity regions 302b, 302c, 302f, and 302g). The greater number of peaks and valleys in the second set, as well has the smaller height of the peaks, may increase the emitted light reflecting outwards from the surface while decreasing (or minimize) the light reflecting inwards, or bouncing back, into the light emitting layer. As less light is reflecting inwards, less heat may be produced by the illumination device.

Figure 4:
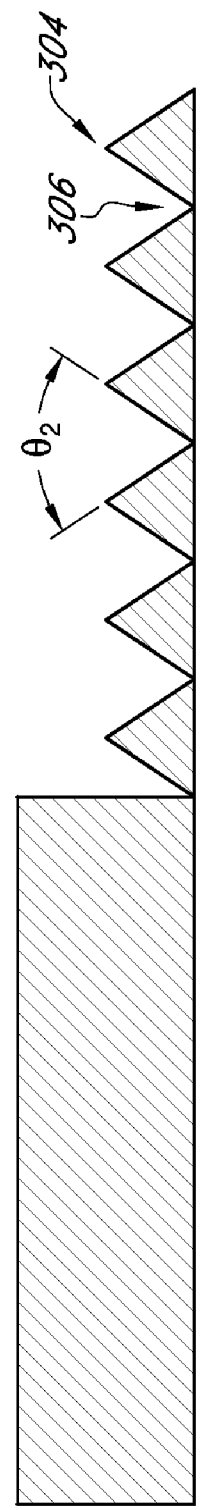
FIG. 4 illustrates a cross-sectional view of a rough surface pattern of the light emitting s layer of the diode taken along line 4-4 of FIG. 3
Figure 5:
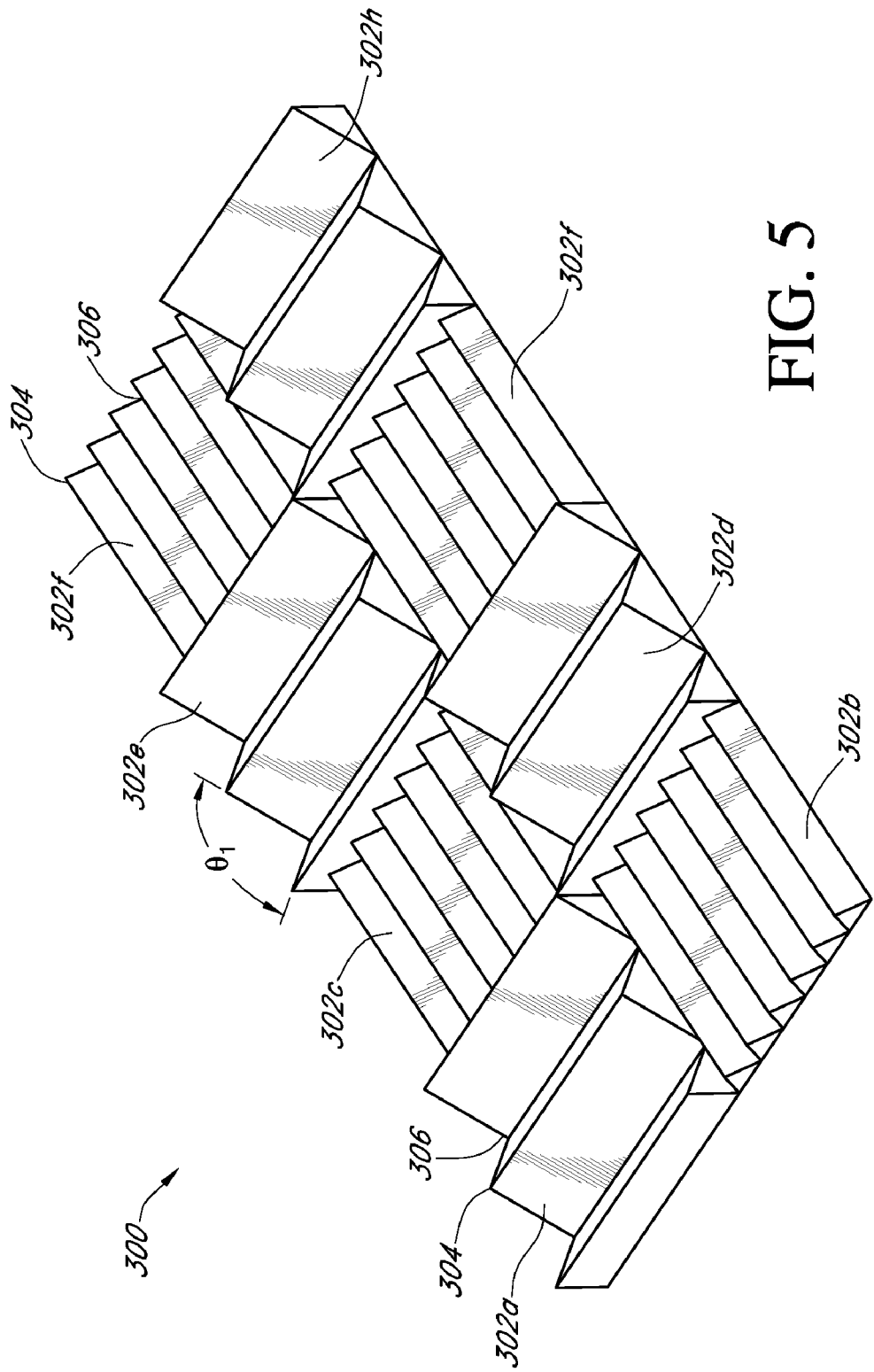
FIG. 5 illustrates a top perspective view of the rough surface pattern of the light emitting layer of the diode of FIG. 3.

FIG. 4 illustrates a cross-sectional view of the rough surface pattern of the light emitting layer 300 of the diode taken along line 4-4 of FIG. 3 FIG. 5 illustrates a top perspective view of the rough surface pattern of the light emitting layer of the diode of FIG. 3.

The pre-determined surface structure may also be in the form of, including, but not limited to, an egg carton shape or a sound stage absorbing pattern.

Polygonal Surface Pattern

Figure 6:
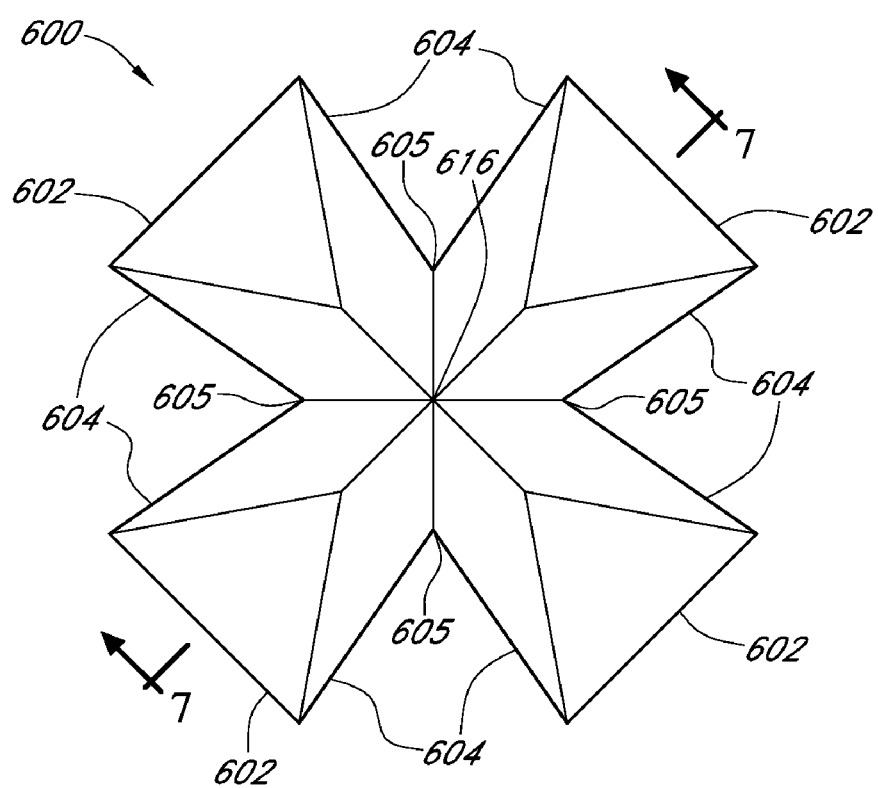
FIG. 6 illustrates a top plan view of a recess etched into a light emitting layer of a diode, according to one aspect.

According to another aspect, the impurity regions may include a plurality of recesses etched into the light emitting layer of the diode. FIG. 6 illustrates a top plan view of a recess 600 etched into a light emitting layer of a diode. The recess may include eight (8) sides or facets on a lower internal portion of the recess while the upper internal portion of the recess may include sixteen (16) smaller sides or facets. (FIGS. 6 and 8) In one aspect, the facets may be similar to the ideal proportional cut of a round brilliance diamond.

The 16 facets of the upper internal surface may slope inwardly at an angle ranging between 90° and 98.5° providing an optimal angle of refraction causing light reflected outwards to increase while light reflecting or bouncing back into the surface of the diode may be minimized. However, the range of 90° and 98.5° is by example only and other angles which may allow the light to be directed outwards while minimizing light reflected into the surface of the diode may be used.

Figure 8:
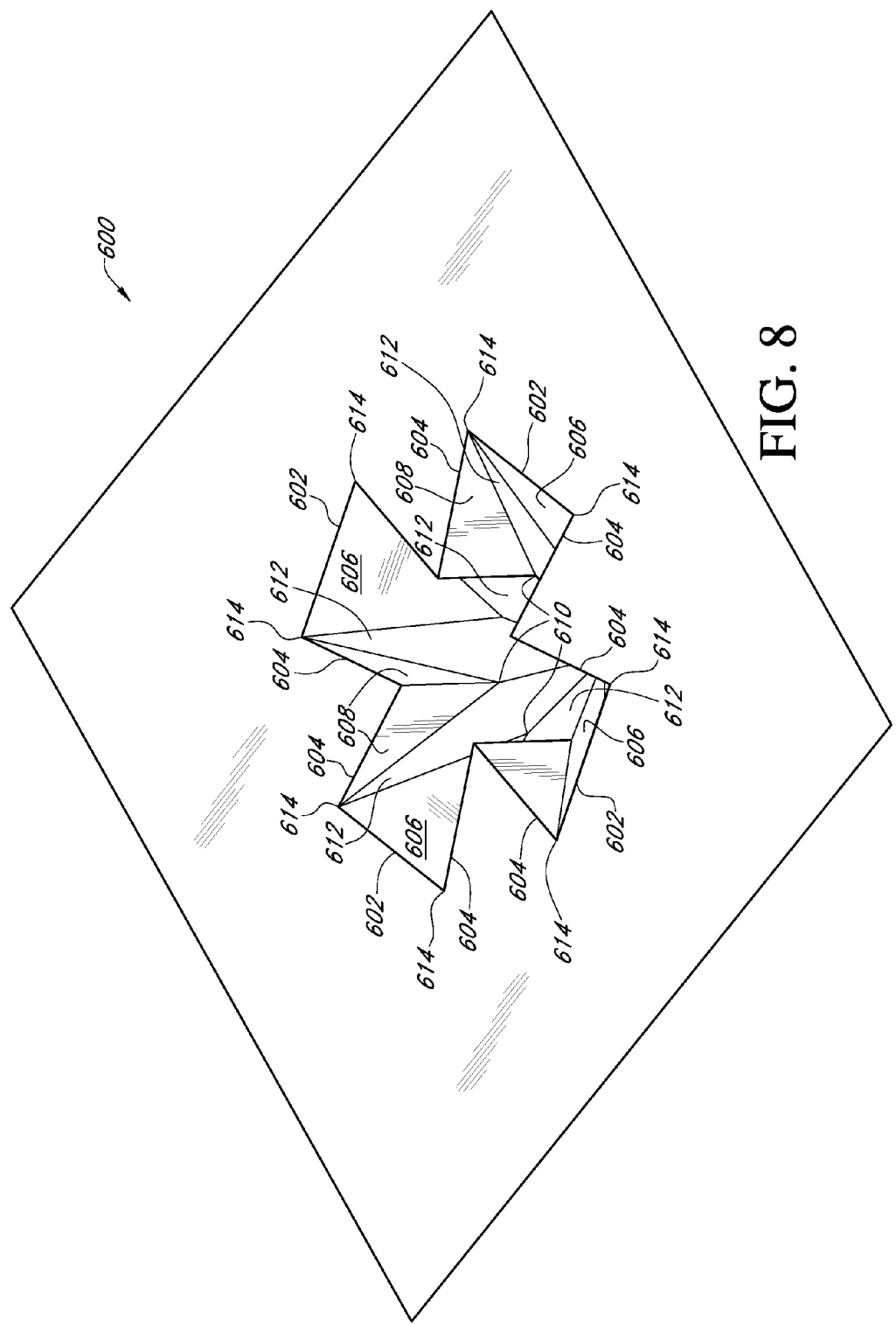
FIG. 8 illustrates a top perspective view of the recess of FIG. 6.

The recess 600 may include a plurality of outer side edges 602 integrally connected to a plurality of inwardly projecting side edges 604 forming an outer surface perimeter. The junction or intersection of the plurality of inwardly projecting side edges 604 may form upper contact points 605 for assisting or guiding the current across the light emitting layer of the diode. The plurality of outer side edges 602 may be integrally connected to a first plurality of downwardly sloping side walls (or facets) 606 projecting inwardly. In one aspect, the first plurality of downwardly sloping side walls 606 may extend partially downwards into the recess at an angle of 45°, to center contact points 610, forming a triangular surface area. (FIG. 8)

The plurality of inwardly projecting side edges 604 may be integrally connected to a plurality of vertical side walls 608 extending downwards into the recess at an angle of 90° and converging to the center contact points 610, approximately half way between a top edge of the vertical side walls and a bottom contact point 616, such that each vertical side wall may form an equilateral triangle.

A second plurality of downwardly sloping side walls 612 having a first end 614, formed at a junction of the outer side edges 602 and inwardly projecting side edges 604, may extend downwards into the recess at an angle of 45° and converge at the bottom contact point 616 (FIGS. 6 and 7) of the recess 600. The convergence of the second plurality of downwardly sloping side walls 612 may create an angle α. In one aspect, α may be 98.5°; however this is by example only and α may be any other angle that provides for the maximization of light to be reflected outwards away from the light emitting layer, thus increasing the light intensity of the LED and reducing heat output. As described below in more detail, the upper 605, center 610 and bottom 616 contact points may be used to guide the flow of current through a light emitting layer of a diode.

Figure 7:
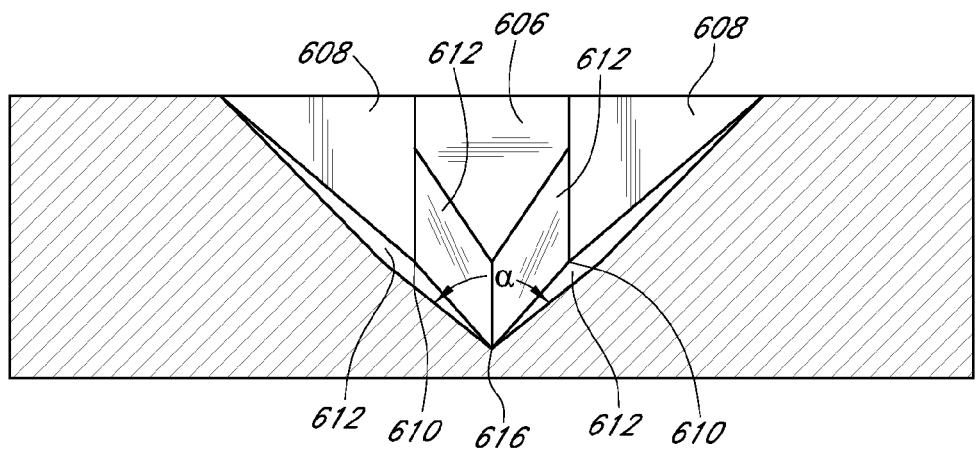
FIG. 7 illustrates a cross-sectional view of the recess taken along line 7-7 of FIG. 6.

FIG. 7 illustrates a cross-sectional view of the rough surface pattern the light emitting layer of the recess taken along line 7-7 of FIG. 6. FIG. 8 illustrates a top perspective view of the recess of FIG. 6.

Figure 9:
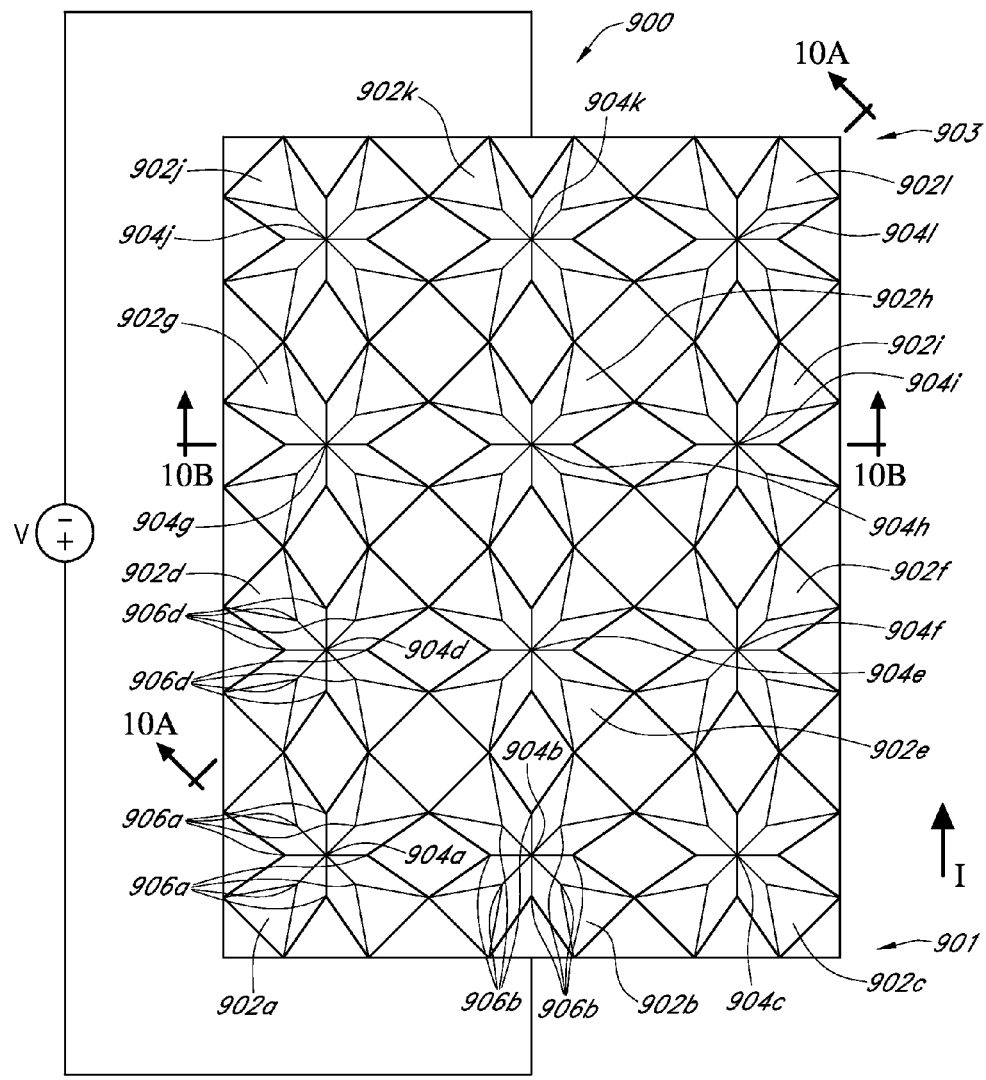
FIG. 9 illustrates a top plan view of a rough surface pattern of a light emitting layer of a diode according to one aspect.

FIG. 9 illustrates a top plan view of a rough surface pattern of a light emitting layer 900 of a diode according to one aspect. The layer 900 may include a plurality of impurity regions 902a-902l where each impurity region may include a recess. As shown, the plurality or impurities, and corresponding recesses, may be organized into an array of rows and columns between a first end 901 and a second end 903 of the light emitting layer 900. The rows and columns of the array may be aligned such that each row may include the same number of recesses and each column may include the same number of recesses. For example, a row may contain three impurity regions, each impurity region having a complete recess (i.e. not partial), and a column may contain four impurity regions, each impurity region having a complete (i.e. not partial) recess. The number of recesses in rows and columns, as described above, is by way of example only and more or less recesses may be used.

The center and bottom contact points in each recess may be separated from center and lower contact points in adjacent recesses by gaps. For example, center contact points 906a and bottom contact point 904a in the first recess 902a may be separated from center contact points 906d and bottom contact point 904d in the fourth recess 902d by gaps, where a center gap is the distance between the center contact points in adjacent recesses and a bottom gap is the distance between bottom contact points in adjacent recesses (either adjacent in the row or in the column).

Applying a voltage (V) across the light emitting layer 900 of the diode may cause a current to flow from the first end 901 of the diode to the second end 903 of the diode through the impurity regions. The current flowing through the impurity regions may cause free electrons moving across the light emitting layer of the diode to fall into empty holes in the P-type layer of the diode resulting in the electrons releasing energy in the form of photons, i.e. light. As discussed above, the center 906 and bottom 904 contact points may function as serially connected electrodes such that the gaps created between the contact points in adjacent recesses may act as spark gaps allowing for the current to flow from the first end 901 of the diode to the second end 903. For example, the distance between a first bottom contact point 904a in a first recess 902a and a second bottom contact point 904b in the second recess 902b as well as the distance to a fourth bottom contact point 904d in the fourth recess 902d may form spark gaps so that current flowing through the first recess 902a may jump to the second recess 902b and/or fourth recess 902d via the bottom contact points 904a, 904b, 904d.

Additionally, the current may flow through the plurality of recesses in the light emitting layer 900 of the diode via center contact points 906. For example, the distance between one or more center contact points 906a in the first recess 902a and one or more center contact points 906d in the fourth recess 902d and/or one or more center contact points 906b in the second recess 902b may also form spark gaps so that current flowing through the first recess 902a may jump to the second recess 902b and/or fourth recess 902d via the center contact points 906. Although not specifically labeled, all recesses may include center contact points 906.

Figure 10A:
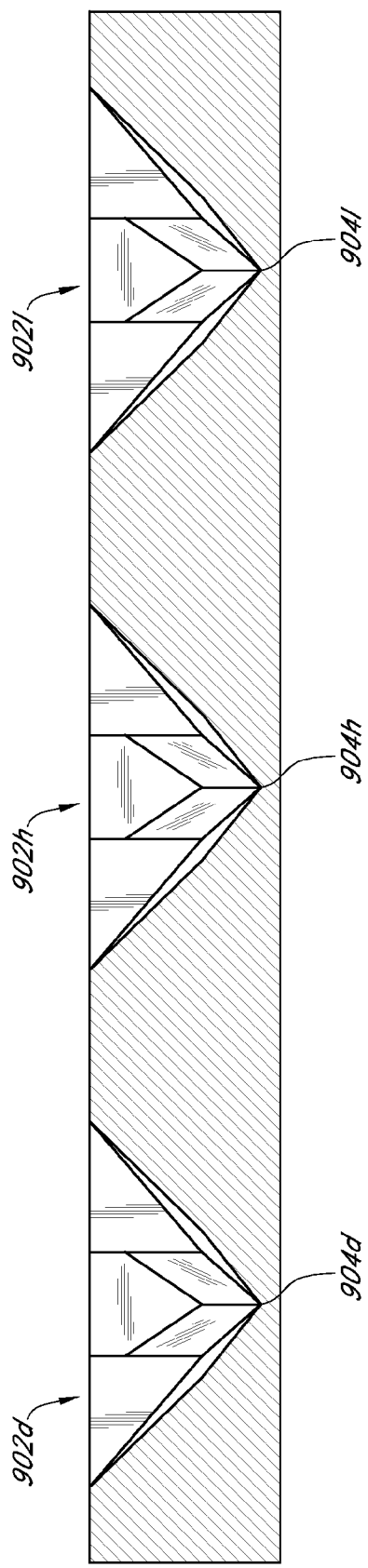
FIG. 10A illustrates a cross-sectional view of the rough surface pattern of the light emitting layer of the diode taken along line 10A-10A of FIG. 9.
Figure 10B:
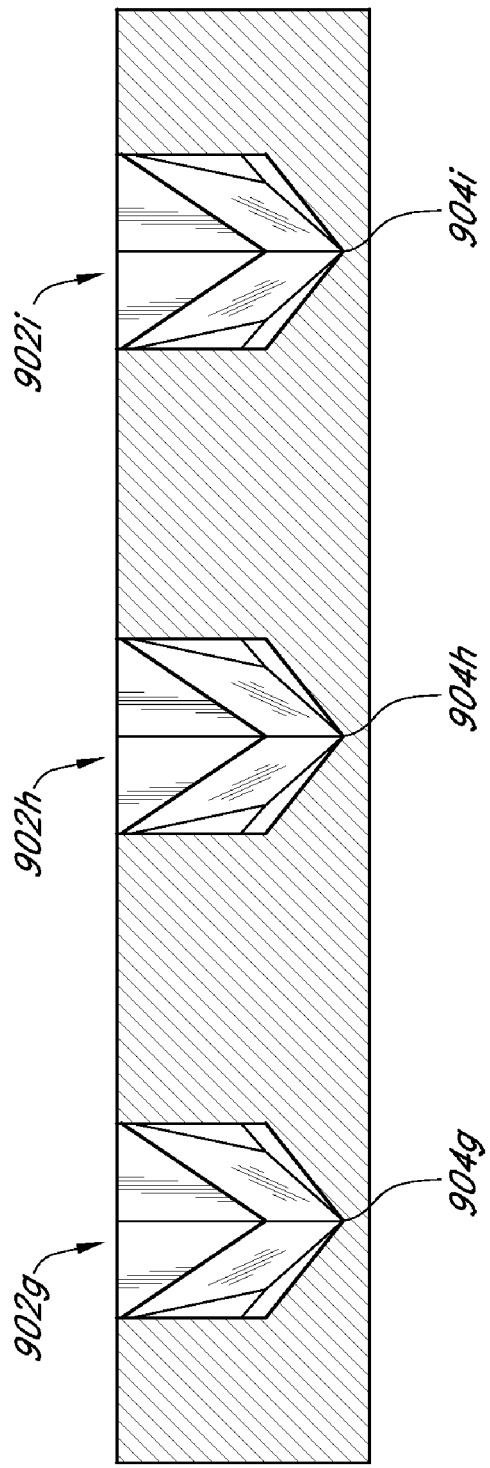
FIG. 10B illustrates a cross-sectional view of the rough surface pattern of the light emitting layer of the diode taken along line 10B-10B of FIG. 9.
Figure 11:
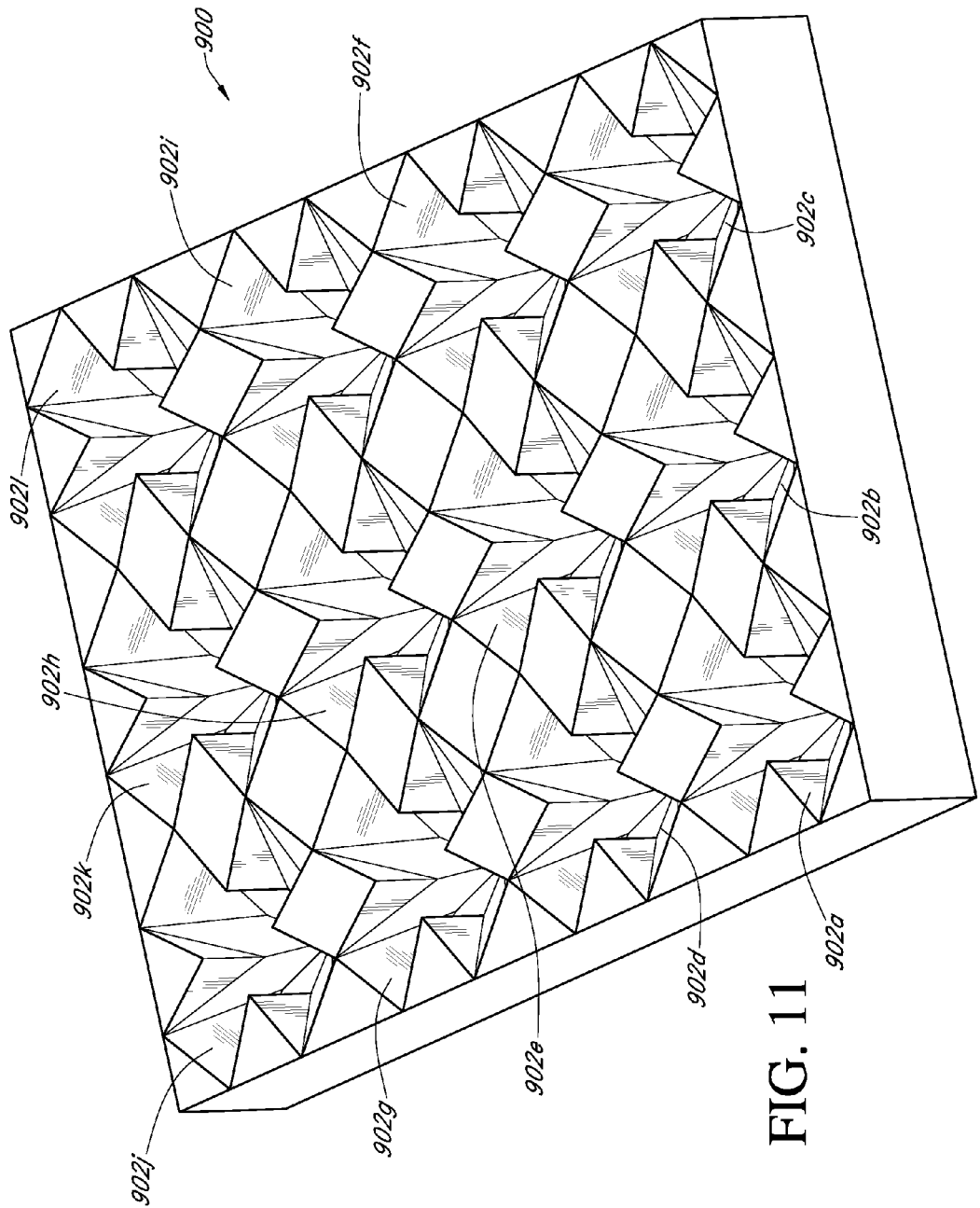
FIG. 11 illustrates a top perspective view of the rough surface pattern of a light emitting layer of the diode of FIG. 9

FIG. 10A illustrates a cross-sectional view of the rough surface pattern of the light emitting layer 900 of the diode taken along line 10A-10A of FIG. 9. FIG. 10B illustrates a cross-sectional view of the rough surface pattern of the light emitting layer 900 of the diode taken along line 10B-10B of FIG. 9. FIG. 11 illustrates a top perspective view of the rough surface pattern of the light emitting layer 900 of the diode of FIG. 9

Figure 12:
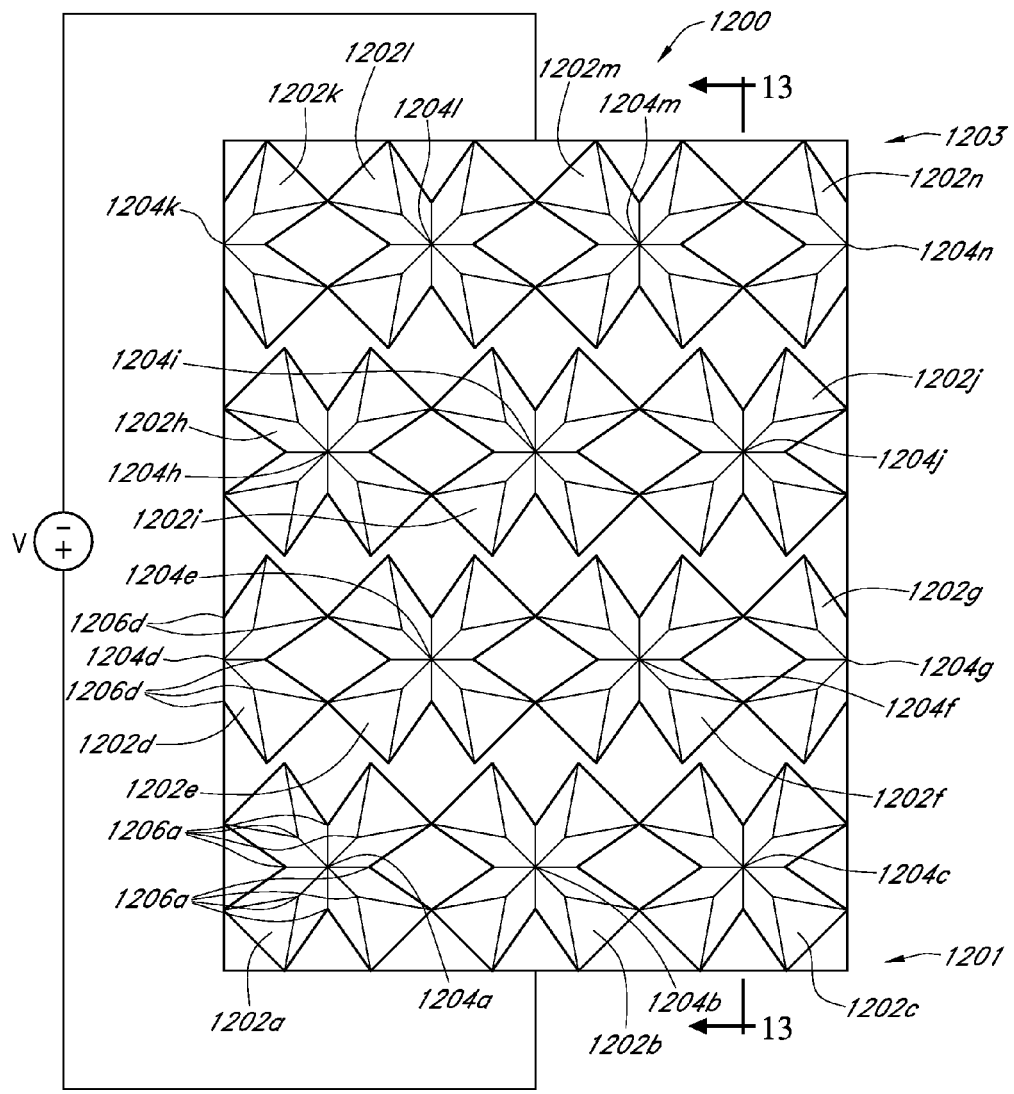
FIG. 12 illustrates a top view of the rough surface pattern of a light emitting layer of a diode according to one aspect.

FIG. 12 illustrates a top plan view of a rough surface pattern of a light emitting layer 1200 of a diode according to one aspect. The light emitting layer 1200 of the diode may include a plurality of impurity regions 1202a-1202n where each impurity region may include a recess.

In one aspect, the plurality of impurity regions may be organized into an array of rows where alternating rows of the array may be off-set. The off-set may be a distance of half a plurality region or recess, however this is by way of example and alternating rows may be off-set by different distances, such as ¾ of an impurity region or recess.

As shown in FIG. 12, a second row of impurity regions (comprising impurity regions 1202d, 1202e, 1202f, 1202g, where 1202d and 1202g may each be half an impurity region containing half a recess) and a fourth row of impurity regions (comprising impurity regions 1202k, 12021, 1202m, 1202n, where 1202k and 1202n may each be half an impurity region containing half a recess) may be off-set from a first row of impurity regions (comprising impurity regions 1202a, 1202b, 1202c) and a third row of impurity regions (comprising impurity regions 1202h, 1202i, 1202j) by a specified distance, such as the length of half an impurity region or the length of ¾ of an impurity regions)

By off-setting alternating rows of impurity regions in an array, spark gaps created between center 1206 and bottom contact points (1204a-1204n), as described above, may be closer together, i.e. a smaller gap, which in turn may increase the efficiency of the light emitting layer as less energy is lost as the current may continuously flows from a first end 1201 to a second end 1203 of the light emitting layer 1200 and not merely jumping between impurity regions. Although not specifically labeled, all recesses may include center contact points 1206.

In other words, by off-setting the rows, the spark gap distance between center 1206 and bottom 1204 contact points may be decreased which in turn may allow the current to continuously flow through the light emitting surface. As a result of the continuous flow of current through the light emitting surface layer, the current may be able to flow through a greater surface area of the light emitting layer allowing for the generation and emission of more light. In other words, the current may be guided through the light emitting layer from a first end 1201 to a second end 1203. As more of the light is emitted outward, less light may be reflected inwards which in turns reduces the heat dissipated.

Figure 13:
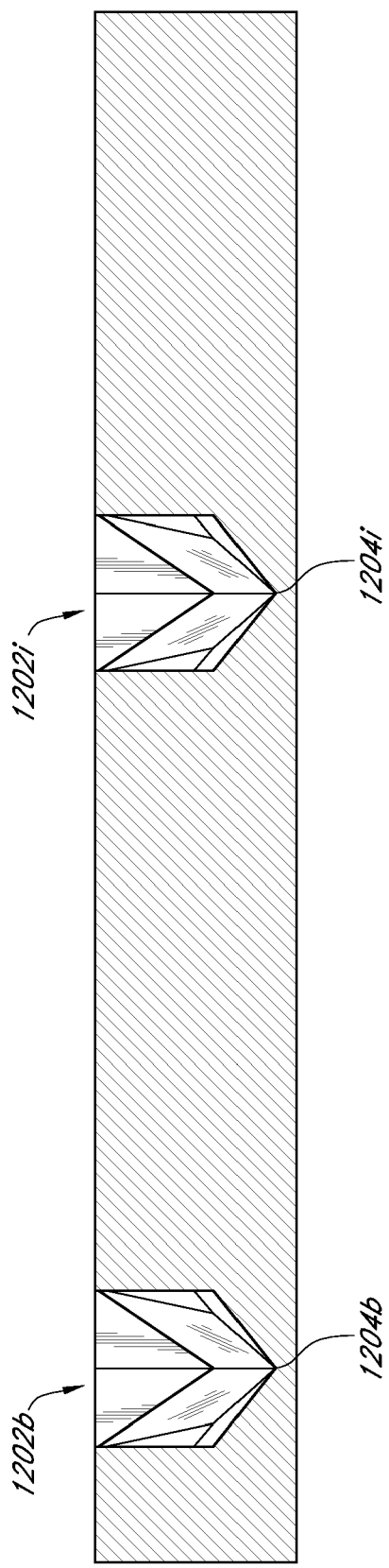
FIG. 13 illustrates a cross-sectional view of the rough surface pattern of the light emitting surface of the diode taken along line 13-13 of FIG. 12.
Figure 14:
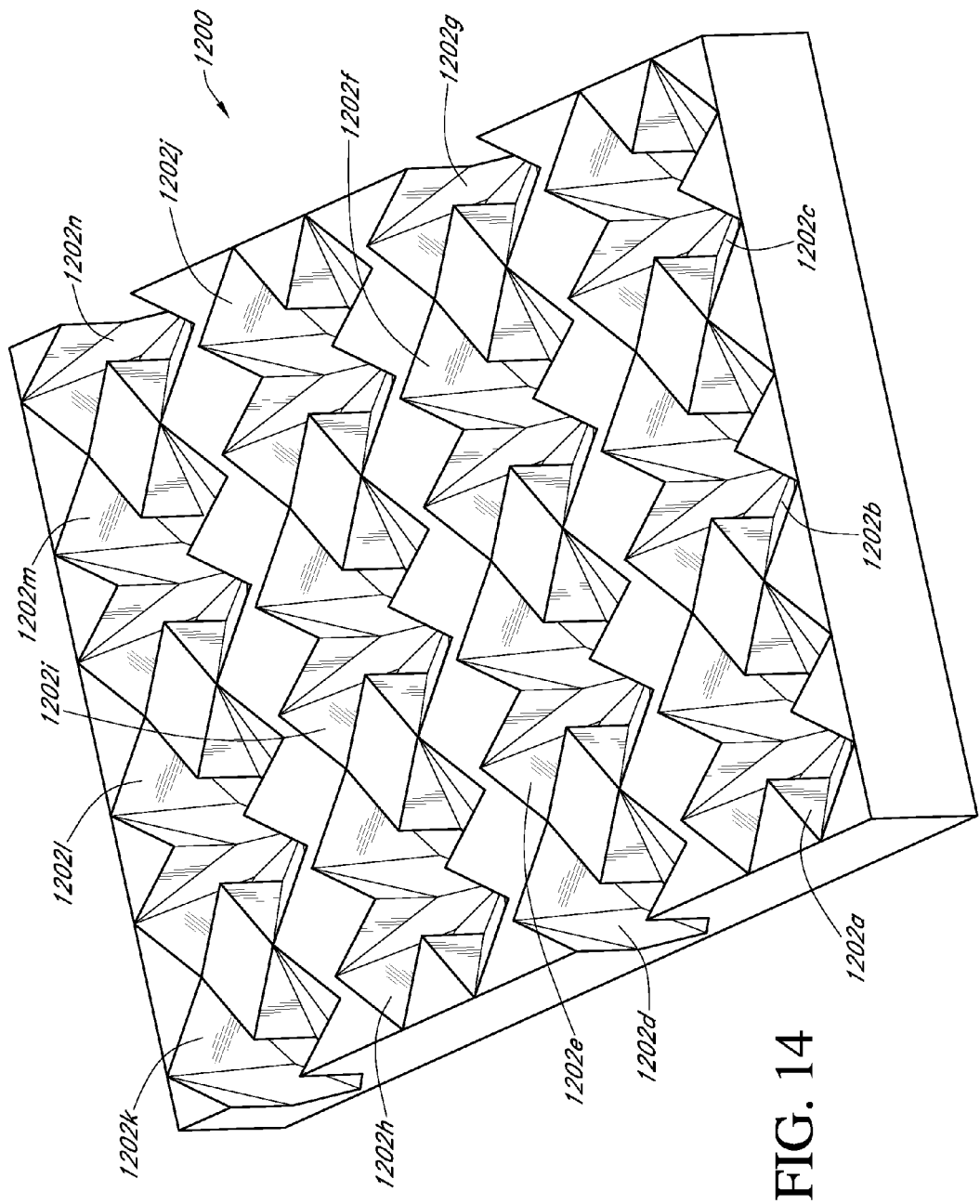
FIG. 14 illustrates a top perspective view of the rough surface pattern of the light emitting layer of the diode of FIG. 12.

FIG. 13 illustrates a cross-sectional view of the light emitting layer of the diode taken along line 13-13 of FIG. 12. FIG. 14 illustrates a top perspective view of the light emitting layer of the diode of FIG. 12.

One or more of the components and functions illustrated in the figures may be rearranged and/or combined into a single component or embodied in several components without departing from the present application. Additional elements or components may also be added without departing from the present application. The apparatus, devices, and/or components illustrated in the figures may be configured to perform the methods, features, or steps illustrated in FIG. 1-14.

While certain exemplary embodiments have been described and shown in the accompanying drawings, it is to be understood that such embodiments are merely illustrative of and not restrictive on the broad application, and that this application not be limited to the specific constructions and arrangements shown and described, since various other modifications are possible. Those skilled, in the art will appreciate that various adaptations and modifications of the just described preferred embodiment can be configured without departing from the scope and spirit of the present application. Therefore, it is to be understood that, within the scope of the appended claims, the present application may be practiced other than as specifically described herein.

What is claimed is:

1. A light emitting diode, comprising:
a plurality of semiconductor layers at least one of which has a light emitting layer having a top and a bottom surface, the light emitting layer, comprising:
one or more impurity regions, each impurity region in the one or more impurity regions having a recess for guiding current through the light emitting layer and causing the emission of light, the recess comprising:
a lower internal portion having a bottom contact point located on the bottom surface; and
an upper internal portion integrally connected to the lower internal portion by a plurality of center contact points.

2. The light emitting diode of claim 1, where the recess further comprises:
a plurality of outer side edges;
a plurality of inwardly projecting side edges integrally connected to the plurality of outer side edges forming an outer surface perimeter; and
a first plurality of downwardly sloping side walls integrally connected to the plurality of outer side edges, the first plurality of downwardly sloping side walls projecting inwardly to the plurality of center contact points.

3. The light emitting diode of claim 2, wherein the first plurality of downwardly sloping side walls slope inward at an angle of 45° and wherein each of the first plurality of downwardly sloping side walls has a triangular surface area.

4. The light emitting diode of claim 2, wherein the recess further comprises a plurality of vertical side walls are integrally connected to the plurality of inwardly projecting side edges, the plurality of vertical side walls extend in a downwardly direction from the outer surface perimeter.

5. The light emitting diode of claim 4, wherein the plurality of vertical side walls extend downwardly, from the outer surface perimeter, at an angle of 90° converging to the plurality of center contact points, the plurality of center contact points half way between the outer surface perimeter and the bottom contact point and wherein each vertical side wall forms an equilateral triangle.

6. The light emitting diode of claim 2, wherein the recess further comprises a second plurality of downwardly sloping side walls, each side wall of the second plurality of downwardly sloping side walls having a first end formed at the junction of the outer side edges and the plurality of inwardly projecting side edges and a second end formed at the bottom contact point.

7. The light emitting diode of claim 6, wherein the second plurality of downwardly sloping side walls extend downwardly from the outer surface perimeter at an angle of 45° and converge at the bottom contact point.

8. The light emitting diode of claim 7, wherein the second plurality of downwardly sloping side walls converge at an angle of 98.5°.

9. The light emitting diode of claim 1, wherein a voltage is applied to the light emitting layer causing current to flow from a first end of the light emitting layer to a second end of the light emitting layer through the plurality of impurity regions causing free electrons moving across the light emitting layer to fall into empty holes in a p-type layer of the light emitting layer releasing energy in a form of light.

10. The light emitting diode of claim 9, wherein the plurality of center contact points and bottom contact point function as serially connected electrodes such that contact points in adjacent recesses form spark gaps allowing the current to flow through each of the plurality of recesses and release the energy in the form of the light.

11. The light emitting diode of claim 1, wherein each of the recesses in the one or more impurity regions are organized into an array of rows and columns between the first and second ends of the light emitting layer.

12. The light emitting diode of claim 11, wherein the rows and the columns are aligned.

13. The light emitting diode of claim 11, wherein alternating rows in the array are offset for reducing a distance between a first plurality of center contact points in a first recess and a second plurality of center contact points in a second recess, the distance creating a spark gap.

14. The light emitting diode of claim 11, wherein a row includes three impurity regions and a column includes four impurity regions.

15. The light emitting diode of claim 13, wherein off-set rows in the array comprise two full recesses and two partial recesses.

16. The light emitting diode of claim 1, wherein the light emitting layer is comprised of silicon carbide.

17. The light emitting diode of claim 1, wherein light is emitted from the upper and lower internal portions of the recesses minimizing internal reflections and increasing emitted light.

18. The light emitting diode of claim 1, wherein each recess is etched into the light emitting layer.

19. A light emitting diode, comprising:
a plurality of semiconductor layers at least one of which has a light emitting layer, the light emitting layer, comprising:
one or more impurity regions, each impurity region having a recess for emitting light and guiding current through the light emitting layer, the recess comprising: a plurality of outer side edges; a plurality of inwardly projecting side edges integrally connected to the plurality of outer side edges forming an outer surface perimeter, the junction of the inwardly projecting side edges forming an upper contact point; and
a first plurality of downwardly sloping side walls integrally connected to the outer side edges, the first plurality of downwardly sloping side walls projecting inwardly to a bottom contact point.

20. The light emitting diode of claim 19, wherein the light emitting layer is comprised of silicon carbide.

* * * * *